United States Patent
Inazuki et al.

(10) Patent No.: US 9,366,951 B2
(45) Date of Patent: Jun. 14, 2016

(54) HALFTONE PHASE SHIFT PHOTOMASK BLANK, HALFTONE PHASE SHIFT PHOTOMASK AND PATTERN EXPOSURE METHOD

(71) Applicant: Shin-Etsu Chemical Co., Ltd., Tokyo (JP)

(72) Inventors: Yukio Inazuki, Joetsu (JP); Toyohisa Sakurada, Joetsu (JP); Hideo Kaneko, Joetsu (JP); Takuro Kosaka, Joetsu (JP); Kouhei Sasamoto, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 121 days.

(21) Appl. No.: 14/520,415

(22) Filed: Oct. 22, 2014

(65) Prior Publication Data

US 2015/0125785 A1    May 7, 2015

(30) Foreign Application Priority Data

Nov. 6, 2013 (JP) ................................. 2013-229984
Sep. 11, 2014 (JP) ................................. 2014-184992

(51) Int. Cl.
*G03F 1/26* (2012.01)
*G03F 1/32* (2012.01)
*G03F 1/00* (2012.01)
*G03F 7/20* (2006.01)

(52) U.S. Cl.
CPC ................. *G03F 1/26* (2013.01); *G03F 1/0046* (2013.01); *G03F 1/0076* (2013.01); *G03F 1/32* (2013.01); *G03F 7/2002* (2013.01)

(58) Field of Classification Search
CPC .......................................................... G03F 1/26
USPC ............................................................ 430/5
See application file for complete search history.

(56) References Cited

U.S. PATENT DOCUMENTS

| | | | |
|---|---|---|---|
| 5,474,864 A | 12/1995 | Isao et al. | |
| 7,179,545 B2 | 2/2007 | Okazaki et al. | |
| 7,767,366 B2 | 8/2010 | Yoshikawa et al. | |
| 7,771,893 B2 | 8/2010 | Yoshikawa et al. | |
| 7,935,461 B2 | 5/2011 | Nozawa et al. | |
| 7,941,767 B2 | 5/2011 | Mukai et al. | |
| 2003/0180630 A1 | 9/2003 | Shiota et al. | |
| 2007/0243491 A1 | 10/2007 | Wu et al. | |
| 2009/0246647 A1 | 10/2009 | Hashimoto et al. | |
| 2013/0130159 A1* | 5/2013 | Yoshikawa | G03F 1/32 430/5 |

FOREIGN PATENT DOCUMENTS

| | | |
|---|---|---|
| JP | 7-140635 A | 6/1995 |
| JP | 10-171096 A | 6/1998 |
| JP | 2004-133029 A | 4/2004 |
| JP | 2007-33469 A | 2/2007 |
| JP | 2007-233179 A | 9/2007 |
| JP | 2007-241065 A | 9/2007 |
| JP | 2008-276002 A | 11/2008 |
| JP | 2010-9038 A | 1/2010 |

OTHER PUBLICATIONS

Extended Eurpoean Search Report dated May 15. 2015, issued in European Patent Application No. 14190018.3, in English language.
Faure et al., "Characterization of Binary and Attenuated Phase Shift Mask Blanks for 32nm Mask Fabrication", Proc. of SPIE vol. 7122, pp. 712209-1 to 712209-12, 2008.

* cited by examiner

*Primary Examiner* — Stephen Rosasco
(74) *Attorney, Agent, or Firm* — Birch, Stewart, Kolasch & Birch, LLP

(57) ABSTRACT

A halftone phase shift photomask blank comprising a transparent substrate and a halftone phase shift film is provided. The phase shift film consists of Si and N, or Si, N and O, and is free of transition metals. The phase shift film has a thickness of 40-70 nm, offers a transmittance of 10-40% and a phase shift of 150-200° relative to light of wavelength up to 200 nm, and is resistant to cleaning chemicals.

11 Claims, No Drawings

HALFTONE PHASE SHIFT PHOTOMASK BLANK, HALFTONE PHASE SHIFT PHOTOMASK AND PATTERN EXPOSURE METHOD

CROSS-REFERENCE TO RELATED APPLICATION

This non-provisional application claims priority under 35 U.S.C. §119(d) on Patent Application Nos. 2013-229984 and 2014-184992 filed in Japan on Nov. 6, 2013 and Sep. 11, 2014, respectively, the entire contents of which are hereby incorporated by reference.

TECHNICAL FIELD

This invention relates to a halftone phase shift photomask blank, halftone phase shift photomask, and pattern exposure method, which are applied to the microfabrication of semiconductor integrated circuits or the like.

BACKGROUND ART

In the field of semiconductor technology, research and development efforts are continued for further miniaturization of pattern features. Recently, as advances including miniaturization of circuit patterns, thinning of interconnect patterns and miniaturization of contact hole patterns for connection between cell-constituting layers are in progress to comply with higher integration density of LSIs, there is an increasing demand for the micropatterning technology. Accordingly, in conjunction with the technology for manufacturing photomasks used in the exposure step of the photolithographic microfabrication process, it is desired to have a technique of forming a more fine and accurate circuit pattern or mask pattern.

In general, reduction projection is employed when patterns are formed on semiconductor substrates by photolithography. Thus the size of pattern features formed on a photomask is about 4 times the size of pattern features formed or a semiconductor substrate. In the current photolithography technology, the size of circuit patterns printed is significantly smaller than the wavelength of light used for exposure. Therefore, if a photomask pattern is forced simply by multiplying the size of circuit pattern 4 times, the desired pattern is not transferred to a resist film on a semiconductor substrate due to optical interference and other effects during exposure.

Sometimes, optical interference and other effects during exposure are minimized by forming the pattern on a photomask to a more complex shape than the actual circuit pattern. Such a complex pattern shape may be designed, for example, by incorporating optical proximity correction (OPC) into the actual circuit pattern. Also, attempts are made to apply such technologies as modified illumination, immersion lithography,, resolution enhancement technology (RET), and double exposure (or double patterning) lithography, to meet the demand for miniaturization and higher accuracy of patterns.

The phase shift method is used as one of the RET. The phase shift method is by forming a pattern of film capable of phase reversal of approximately 180 degrees on a photomask, such that contrast may be improved by utilizing light interference. One of the photomasks adapted for the phase shift method is a halftone phase shift photomask. Typically, the halftone phase shift photomask includes a substrate of quartz or similar material which is transparent to exposure light, and a photomask pattern of halftone phase shift film formed on the substrate, capable of a phase shift of approximately 180 degrees and having an insufficient transmittance to contribute to pattern formation. As the halftone phase shift photomask, JP-A H07-140635 proposes a mask having a halftone phase shift film of molybdenum silicide oxide (MoSiO) or molybdenum silicide oxynitride (MoSiON).

For the purpose of forming finer images by photolithography, light of shorter wavelength is used as the light source. In the currently most advanced stage of photography process, the exposure light source has made a transition from KrF excimer laser (248 nm) to ArF excimer laser (193 nm). The lithography using ArF excimer laser light of greater energy was found to cause damages to the mask, which were not observed with KrF excimer laser light. One problem is that on continuous use of the photomask, foreign matter-like growth defects form on the photomask. These growth defects are also known as "haze". The source of haze formation was formerly believed to reside in the growth of ammonium sulfate crystals on the mask pattern surface. It is currently believed that organic matter participates in haze formation as well.

Some approaches are known to overcome the haze problem. With respect to the growth defects formed on the photomask upon long-term irradiation of ArF excimer laser light, for example, JP-A 2008-276002 describes that if the photomask is cleaned at a predetermined stage, then the photomask can be continuously used.

CITATION LIST

Patent Document 1: JP-A H07-140635
Patent Document 2: JP-A 2008-276002 (U.S. Pat. No. 7,941,767)
Patent Document 3: JP-A 2010-009038
Patent Document 4: JP-A 2007-033469
Patent Document 5: JP-A 2007-233179
Patent Document 6: JP-A 2007-241065
Patent Document 7: JP-A H10-171096
Patent Document 8: JP-A 2004-133029
Non-Patent Document 1; Thomas Faure at al., "Characterization of binary mask and attenuated phase shift mask blanks for 32 nm mask fabrication," Proc. of SPIE, vol. 7122, pp712209-1 to 712209-12

SUMMARY OF INVENTION

The photomask technology has the tendency that with a progress of miniaturization, the pattern width becomes smaller than the exposure wavelength. Accordingly, RET technologies such as OPC, modified illumination, immersion lithography, phase shift method, and double exposure are employed as mentioned above. With reference to the phase shift method, a halftone phase shift film with transmittance about 6% is used in the prior art. When if is desired to form a pattern with a narrower width, for example, a pattern with a half pitch of up to 50 nm by photolithography, a phase shift film with a higher transmittance is necessary to gain a higher contrast ratio. Specifically, a phase shift film having a phase shift of about 180 degrees and a transmittance of 10% to 40% is needed.

A halftone phase shift photomask with a higher transmittance may be manufactured by a method of forming a phase shift film on a transparent substrate of quarts or the like and digging the substrate until a phase shift of 180° is reached, for example, a method of forming a phase shift film providing a low transmittance of about 6% and a phase shift of 180° at a predetermined thickness, to a thickness thinner than the predetermined thickness so as to provide a high transmittance, and compensating for a shortage of phase shift by digging (or etching) until a phase shift 180° is reached, or a method of forming a SiO film for phase adjustment and a Cr film for transmittance adjustment in combination, for tailoring transmittance in a controlled manner.

However, the photomask obtained by digging the substrate is difficult in accurate control of a phase shift and also difficult to make corrections when defects are formed in the pattern. On the other hand, the two-layer photomask using two films having different etch properties, typically SiO film and Cr film has drawbacks including an increased number of etching steps involved in pattern formation and an increased film thickness in excess of 100 nm to produce a phase shift of 180°.

As improvements in these respects, Patent Document 3 discloses a film composed mainly of metal, silicon, and nitrogen. The film is as thick as 74 nm. However, a thinner film is advantageous for pattern formation and effective for reducing 3D effect. Thus, a thinner film is required in order for photolithography to form a finer pattern.

On use of a photomask blank in the photomask producing process, if foreign deposits are on the photomask blank, they cause pattern defects. To remove foreign deposits, the photomask blank is cleaned many times during the photomask producing process. Further, when the photomask thus produced is used in the photolithography process, the photomask is also repeatedly cleaned even if the photomask itself is free of pattern defects, for the reason that if foreign deposits settle on the photomask during the photolithography process, a semiconductor substrate which is patterned using that photomask eventually bears pattern-transfer failures.

For removing foreign deposits from the photomask blank or photomask, chemical cleaning is applied in most cases, using SPM, ozone water or AMP. SPM is a sulfuric acid/hydrogen peroxide mixture which is a cleaning agent having strong oxidizing action. Ozone water is water having ozone dissolved therein and used as a replacement of SPM. AMP is an aqueous ammonia/hydrogen peroxide mixture. When the photomask blank or photomask having organic foreign deposits on its surface is immersed in the AMP cleaning liquid, the organic foreign deposits are liberated and removed from the surface under the dissolving action of ammonia and the oxidizing action of hydrogen peroxide.

Although the chemical cleaning with such chemical liquid is necessary for removing foreign deposits such as particles and contaminants on the photomask blank or photomask, the chemical cleaning can damage an optical film, typically halftone phase shift film, on the photomask blank or photomask. For example, if the surface of an optical film is altered by chemical cleaning, the optical properties that the film originally possesses can be changed. In addition, chemical cleaning of the photomask blank or photomask is repeatedly carried out. It is thus necessary to minimize any property change (e.g., phase shift change) of the optical film during every cleaning step.

An object of the invention is to provide a photomask having a halftone phase shift film, a photomask blank therefor, and a pattern exposure method using the photomask, the halftone phase shift film, providing a predetermined phase shift, having a high transmittance and a reduced thickness sufficient to process a photomask pattern, so that the phase shift film may comply with the miniaturization of pattern, and the halftone phase shift film being chemically resistant during chemical cleaning.

The inventors sought for a halftone phase shift film providing a predetermined phase shift and having a high transmittance, a reduced thickness, and chemical resistance. First, a study was made on halftone phase shift films containing transition metals such as molybdenum which are commonly used as the halftone phase shift film. The transition metal-containing halftone phase shift films have the problem that the addition of transition metal brings about a lowering of transmittance. A large amount of oxygen must be added to the transition metal-containing halftone phase shift films in order that the filets may have a high transmittance. This results in increased film thickness and adversely affects chemical resistance.

To address the problem, the inventors put a focus on transition metal-free halftone phase shift films. It has been found that the problem is solved by a halftone phase shift film composed of silicon and nitrogen, or silicon, nitrogen and oxygen. If the halftone phase shift film is a single layer consisting of silicon and nitrogen, or silicon, nitrogen and oxygen, with the content of oxygen being up to 1/3 (in atomic ratio) of the content of nitrogen, and having a refractive index of at least 2.4 and an absorption coefficient of 0.22 to 0.54, or a multilayer film including at least one layer consisting of silicon and nitrogen, or silicon, nitrogen and oxygen, with the content of oxygen being up to 1/3 (in atomic ratio) of the content of nitrogen, and having a refractive index of at least 2.4 and an absorption coefficient of 0.22 to 0.54, then the halftone phase shift film exhibits a transmittance of at least 10% and a phase shift of 150° to 200° relative to light of wavelength up to 200 nm, though it has a thickness of up to 70 nm.

Since the halftone phase shift film ensures the desired phase shift, and has a high transmittance, a reduced thickness, and chemical resistance during chemical cleaning, a halftone phase shift photomask having the film is suited for use in a photolithographic method for forming a pattern with a half pitch of up to 50 nm in a processable substrate, comprising the steps of forming a photoresist film on the processable substrate, and exposing the photoresist film to light of wavelength up to 200 nm through the photomask for thereby transferring the pattern to the photoresist film. The pattern of the photomask can be transferred to the photoresist film at a high accuracy.

The invention provides a halftone phase shift photomask blank, halftone phase shift photomask, and pattern exposure method, as defined below.

[1] A halftone phase shift photomask blank comprising a transparent substrate and a halftone phase shift film thereon,
the halftone phase shift film consisting of silicon and nitrogen, or silicon, nitrogen and oxygen, providing a transmittance of at least 10% and a phase shift of 150° to 200° relative to light of wavelength up to 200 nm, and having a thickness of up to 70 nm,
the halftone phase shift film being a single layer consisting of silicon and nitrogen, or silicon, nitrogen and oxygen, with the content of oxygen being up to 1/3 of the content of nitrogen as expressed in atomic ratio, and having a refractive index of at least 2.4 and an absorption coefficient of 0.22 to 0.54, or a multilayer film including at least one layer consisting of silicon and nitrogen, or silicon, nitrogen and oxygen, with the content of oxygen toeing up to 1/3 of the content of nitrogen as expressed in atomic ratio, and having a refractive index of at least 2.4 and an absorption coefficient of 0.22 to 0.54.

[2] The photomask blank of [1] wherein the halftone phase shift film consists of silicon and nitrogen.

[3] The photomask blank of [1] wherein the halftone phase shift film is a multilayer film including at least one layer consisting of silicon and nitrogen and at least one layer consisting of silicon, nitrogen and oxygen.

[4] The photomask blank of any one of [1] to [3] from which a halftone phase shift photomask is prepared, wherein in a photolithographic method for forming a pattern with a half pitch of up to 50 nm in a processable substrate, the method comprising the steps of forming a photoresist film on the processable substrate, and exposing patternwise the photoresist film to light of wavelength up to 200 nm for thereby transferring the pattern to the photoresist film, the photomask is used in the exposure step.

[5] A halftone phase shift photomask comprising a transparent substrate and a photomask pattern of halftone phase shift film thereon, the halftone phase shift film consisting of silicon and nitrogen, or silicon, nitrogen and oxygen, providing a transmittance of at least 10% and a phase shift of 150° to 200° relative to light of wavelength up to 200 nm, and having a thickness of up to 70 nm, the halftone phase shift film being a single layer consisting of silicon and nitrogen, or silicon, nitrogen and oxygen, with the content of oxygen being up to 1/3 of the content of nitrogen as expressed in atomic ratio, and having a refractive index of at least 2.4 and an absorption coefficient of 0.22 to 0.54, or a multilayer film including at least one layer consisting of silicon and nitrogen, or silicon, nitrogen and oxygen, with the content of oxygen being up to 1/3 of the content of nitrogen as expressed in atomic ratio, and having a refractive index of at least 2.4 and an absorption coefficient of 0.22 to 0.54.

[6] The photomask of [5] wherein the halftone phase shift film consists of silicon and nitrogen.

[7] The photomask of [5] wherein the halftone phase shift film is a multilayer film including at least one layer consisting of silicon and nitrogen and at least one layer consisting of silicon, nitrogen and oxygen,

[8] The photomask of any one of [5] to [7] wherein in a photolithographic method for forming a pattern with a half pitch of up to 50 nm in a processable substrate, the method comprising the steps of forming a photoresist film on the processable substrate, and exposing patternwise the photoresist film to light of wavelength up to 200 nm for thereby transferring the pattern to the photoresist film, the photomask is used in the exposure step.

[9] A pattern exposure method involved in photolithographic formation of a pattern with a half pitch of up to 50 nm in a processable substrate, wherein the pattern is transferred to a photoresist film on the processable substrate, using exposure light of wavelength up to 200 nm, the pattern exposure method using a halftone phase shift photomask, the halftone phase shift photomask comprising a transparent substrate and a photomask pattern of halftone phase shift film thereon, the halftone phase shift film consisting of silicon and nitrogen, or silicon, nitrogen and oxygen, providing a transmittance of at least 10% and a phase shift of 150° to 200° relative to light of wavelength up to 200 nm, and having a thickness of up to 70 nm, the halftone phase shift film being a single layer consisting of silicon and nitrogen, or silicon, nitrogen and oxygen, with the content of oxygen being up to 1/3 of the content of nitrogen as expressed in atomic ratio, and having a refractive index of at least 2.4 and an absorption coefficient of 0.22 to 0.54, or a multilayer film including at least one layer consisting of silicon and nitrogen, or silicon, nitrogen and oxygen, with the content of oxygen being up to 1/3 of the content of nitrogen as expressed in atomic ratio, and having a refractive index of at least 2.4 and an absorption coefficient of 0.22 to 0.54.

[10] The method of [9] wherein the halftone phase shift film consists of silicon and nitrogen.

[11] The method of [9] wherein the halftone phase shift film is a multilayer film including at least one layer consisting of silicon and nitrogen and at least one layer consisting of silicon, nitrogen and oxygen.

ADVANTAGEOUS EFFECTS OF INVENTION

The halftone phase shift photomask blank or halftone phase shift photomask of the invention has a halftone phase shift film that provides the desired phase shift, and has a high transmittance, a reduced thickness sufficient to process a photomask pattern, and chemical resistance during chemical cleaning. Use of the halftone phase shift photomask allows for the pattern exposure step that meets the demand for patterning to a reduced size and at a higher accuracy.

DESCRIPTION OF PREFERRED EMBODIMENTS

The invention is directed to a halftone phase shift photomask blank comprising a transparent substrate such as quarts substrate and a film formed thereon from a silicon base material consisting of silicon and nitrogen, or silicon, nitrogen and oxygen. The halftone phase shift photomask of the invention has a photomask pattern of the silicon base material film. The film of silicon base material is formed as a halftone phase shift film. When formed to a predetermined thickness (specifically, equal to or less than 70 nm), the film offers a predetermined transmittance (specifically, at least 10%) and a predetermined phase shift (specifically, 150° to 200°) relative to light of wavelength up to 200 nm, specifically ArF excimer laser light (193 nm) or $F_2$ laser light (157 nm) commonly used in photolithography using halftone phase shift photomasks.

The halftone phase shift film is formed of a silicon base material which consists of silicon and nitrogen, or silicon, nitrogen and oxygen and is free of transition metals such as molybdenum. The halftone phase shift film may be a single layer formed of a silicon base material consisting of silicon and nitrogen, or silicon, nitrogen and oxygen (the single layer being referred to as layer A) or a multilayer film including at least one layer formed of a silicon base material consisting of silicon and nitrogen, or silicon, nitrogen and oxygen (the at least one layer being referred to as layer B).

The halftone phase shift film including layer A or layer B formed of a silicon base material consisting of silicon and nitrogen, or silicon, nitrogen and oxygen preferably meets in its entirety a predetermined refractive index (specifically, at least 2.4) and a predetermined absorption coefficient (specifically, 0.22 to 0.54). The exclusion of transition metals from the halftone phase shift film offers the advantage that even when the content of oxygen in silicon base material film is reduced to a low level or even to zero, the film provides the predetermined phase shift and the high transmittance. Concomitantly, the film can be reduced in thickness and improved in chemical resistance.

The halftone phase shift film should have a transmittance of at least 10%, which ensures a necessary and sufficient contrast when a pattern with a half pitch of up to 50 nm, especially up to 30 nm is formed by photolithography, and even when a pattern with a half pitch of up to 20 nm is formed by photolithography. For higher contrast, the transmittance should preferably be at least 15% while the upper limit is preferably up to 40%, especially up to 30%.

The phase shift, of the halftone phase shift film is such that a phase shift between the exposure light transmitted by a region of phase shift film (phase shift region) and the exposure light transmitted by a neighboring region where the phase shift film is removed, causes interference of exposure light whereby contrast is increased. Specifically the phase shift is 150 to 200 degrees. Although ordinary phase shift films are set to a phase shift of approximately 180°, it is possible from the standpoint of contrast enhancement to adjust the phase shift below or beyond 180°. For example, setting a phase shift of smaller than 180° is effective for forming a thinner film. It is a matter of course that a phase shift closer to 180° is more effective because a higher contrast is available. In this regard, the phase shift is preferably 160 to 190°, more preferably 175 to 185°, and most preferably approximately 180°.

The thickness of the halftone phase shift film should be up to 70 nm, preferably up to 65 nm, because a thinner film facilitates to form a finer pattern and a photomask pattern of certain thickness is effective for reducing 3D effect. The lower limit of the film thickness is set in the range where the desired optical properties are obtained relative to light of wavelength up to 200 nm, specifically at least 40 nm, more specifically at least 50 nm. In the embodiment wherein the phase shift film is a multilayer film, the thickness of layer B (if two or more layers B are included, the total thickness thereof) is preferably at least 60%, more preferably at least 80% of the total thickness of the phase shift film. Further in the embodiment wherein the phase shift film is a multilayer film, layer B may be disposed adjacent to or remote from the transparent substrate, or at an intermediate in thickness direction.

The silicon base material of the halftone phase shift film is specifically silicon nitride (SiN) or silicon oxynitride (SiON). Containment of another element is acceptable insofar as the content is an impurity or trace level.

With respect to the transmittance of the halftone phase shift film, the invention intends to achieve an increase of transmittance by increasing the content of nitrogen as much as possible, while supplementing a shortage of transmittance by adding a necessary minimum amount of oxygen. Then the content of oxygen can be suppressed to a minimum level, which eventually allows the halftone phase shift film to be thinner. Specifically, the content of oxygen in the silicon base material should be equal to or less than 1/3, preferably equal to or less than 1/5 of the content of nitrogen as expressed in atomic ratio. That is, atomic ratio $O/N \leq 1/3$, preferably $O/N \leq 1/5$.

In the silicon base material, the content of nitrogen is preferably at least 40 atomic percent (at %), more preferably at least 50 at %, and op to 60 at %, more preferably up to 55 at %. The content of oxygen is preferably up to 20 at %, more preferably up to 15 at %, and even more preferably up to 10 at %. The content of silicon is preferably at least 30 at %, more preferably at least 40 at %, and up to 50 at %, more preferably up to 45 at %. The atomic ratio of silicon to nitrogen (Si/N) is preferably from 3/3 to 3/4.

The refractive index becomes higher as the nitrogen content increases, and a higher refractive index allows the film thickness to be reduced. Then layer A or layer B of a silicon base material consisting of silicon and nitrogen, or silicon, nitrogen and oxygen, especially the halftone phase shift film in its entirety should preferably have a refractive index of at least 2.4, more preferably at least 2.5, and even more preferably at least 2.6. A refractive index in the range ensures that a transmittance of at least 10% is obtained due to the minimized oxygen content, despite the absence of transition metals. The upper limit of refractive index is typically up to 2.8.

Layer A or layer B of a silicon base material consisting of silicon and nitrogen, or silicon, nitrogen and oxygen, especially the halftone phase shift film in its entirety should preferably have an absorption coefficient of at least 0.22, more preferably at least 0.3 and tip to 0.54, more preferably up to 0.5, as long as the halftone phase shift film meets the predetermined phase shift, transmittance and thickness.

In order that the halftone phase shift film may be thin, a film with a lower oxygen content is preferred, with an oxygen-free film being more preferred. It is effective from this standpoint that the halftone phase shift film is formed of an oxygen-free silicon base material, that is, a silicon base material consisting of silicon and nitrogen. In this embodiment, the halftone phase shift film may have a multilayer structure including at least two layers having different silicon/nitrogen ratios or a compositionally graded structure wherein the silicon/nitrogen ratio changes stepwise or continuously in thickness direction.

For the halftone phase shift film formed solely of silicon and nitrogen, sometimes its transmittance cannot be increased beyond a certain limit, and the film cannot be endowed with the desired optical properties. Such a problem may be overcome by constructing the halftone phase shift film as a multilayer structure including a high oxygen content layer and a low oxygen content layer. Specifically, the halftone phase shift film may be a multilayer structure including at least one layer of silicon base material consisting of silicon, nitrogen and oxygen as the high oxygen content layer and at least one layer of silicon base material consisting of silicon, nitrogen and oxygen and having a lower oxygen/nitrogen atomic ratio than the high oxygen content layer as the low oxygen content layer; or a multilayer structure including at least one layer of silicon base material consisting of silicon, nitrogen and oxygen as the high oxygen content layer and at least one layer of silicon base material consisting of silicon and nitrogen as the low oxygen content layer.

The multilayer structure mentioned above is also effective for reducing the thickness of the halftone phase shift film. It is possible to achieve an increase of transmittance by increasing the content of nitrogen as much as possible, while supplementing a shortage of transmittance by adding a necessary minimum amount of oxygen. Then the content of oxygen can be suppressed to a minimum level, which eventually allows the halftone phase shift film to be thinned. In this case too, each layer of the multilayer structure may have a graded composition wherein the silicon/nitrogen/oxygen or silicon/nitrogen ratio changes stepwise or continuously in thickness direction.

With respect to the arrangement of a high oxygen content layer and a low oxygen content layer in the halftone phase shift film, for example,, the high oxygen content layer may be disposed remotest from the transparent substrate (i.e., on surface side) or closest to the transparent substrate (i.e., on substrate side). Either structure is effective for reducing reflectivity. From the standpoint of improving the controlled etching of the halftone phase shift film, for example, improving the accuracy of end detection, it is most effective that the low oxygen content layer is disposed closest to the substrate. Exemplary of the multilayer structure are a two-layer structure consisting of a high oxygen content layer and a low oxygen content layer, a three-layer structure having two high oxygen content layers on the surface and substrate sides of a low oxygen content layer, and an alternating layer structure of at least four alternating high and low oxygen content layers.

The halftone phase shift film may be formed by any well-known film deposition techniques. Among others the sputtering technique is preferred because a homogeneous film is readily formed. The sputtering technique may be either DC sputtering or RF sputtering. A choice of target and sputter gas depends on the layer construction and composition. The target used herein may foe a silicon target, silicon nitride target, or target containing both silicon and silicon nitride. The contents of nitrogen and oxygen may be adjusted by effecting reactive sputtering using nitrogen-containing gas and oxygen-containing gas as the reactive sputter gas while adjusting the feed rates of these gases. Examples of the reactive gas include nitrogen gas ($N_2$ gas), oxygen gas ($O_2$ gas), and nitrogen oxide gases ($N_2O$, NO and $NO_2$ gases). As the sputter gas, a rare gas such as helium, neon or argon gas may also be used.

In the embodiment wherein the halftone phase shift film has a multilayer structure, a surface oxidized layer may be formed as a surface-side layer (or outermost surface layer) in order to suppress any change in quality of the halftone phase shift film. The surface oxidized layer may have an oxygen content of at least 20 at %, with even an oxygen content of at least 50 at % being acceptable. The surface oxidized layer may be formed by oxidation, for example, atmospheric or air oxidation, or forced oxidative treatment. The forced oxidative treatment of a silicon base material film may be performed, for example, by treating with ozone gas or ozone water, or by heating at a temperature of about 300° C. in an oxygen-containing atmosphere via oven heating, lamp annealing or laser heating. The surface oxidized layer may preferably have a thickness of up to 10 nm, more preferably up to 5 nm, and even more preferably up to 3 nm, and a thickness of at least 1 nm is sufficient to be effective as an oxide layer. Although the surface oxidized layer may also be formed by increasing the flow rate of oxygen during the sputtering process, the atmospheric oxidation or oxidative treatment mentioned above is recommended to form a substantially defect-free layer.

In the case of a halftone phase shift mask blank, like conventional halftone phase shift mask blanks, a light-shielding film may be formed on the halftone phase shift film in order to define a shielding region of fully shielding exposure light. Although the light-shielding film may be made of any desired materials, a film of chromium base material which can be also utilized as an auxiliary film for etching process is preferred. With respect to the construction and composition of the light-shielding film, a number of reports are known, for example, from Patent Documents 4 and 5. Preferably the light-shielding film is constructed by forming a Cr base light-shielding film, and further depositing thereon a Cr base antireflective film for reducing reflection from the light-shielding film. The light-shielding film and antireflective film each may be a single layer or a multilayer structure. The materials for the Cr base light-shielding film and antireflective film include chromium alone, chromium oxide (CrO), chromium nitride (CrN), chromium carbide (CrC), chromium oxynitride (CrON), chromium oxycarbide (CrOC), chromium nitride carbide (CrNC), and chromium oxide nitride carbide (CrONC).

The Cr base light-shielding film and antireflective film may be deposited by reactive sputtering. The reactive sputtering process uses a target of chromium alone or a target of chromium having one or more of oxygen, nitrogen and carbon added thereto. The sputtering gas is a rare gas such as Ar, He or Ne, to which a gas selected from oxygen-containing gas, nitrogen-containing gas and carbon-containing gas in accordance with the desired composition of a film being deposited is added.

In another version of the embodiment wherein a light-shielding film is provided, an auxiliary film or etch stop film of chromium base material as disclosed in Patent Document 6 may be formed on the halftone phase shift film, and a light-shielding film of silicon, a silicon base compound or transition metal/silicon base compound be formed thereon.

Furthermore, a hard mask film may be formed on the light-shielding film. As the hard mask film, a film having different etching properties from the light-shielding film is desirable. For example, when the light-shielding film is a Cr base film, a film which can be etched with fluoride gas such as $SF_6$ or $CF_4$ is preferably used as the hard mask film. Suitable hard mask films include a silicon film, a film containing silicon and nitrogen and/or oxygen, and a film containing silicon, nitrogen and/or oxygen, and a transition metal such as molybdenum, tantalum or zirconium.

The photomask blank may be processed into a photomask by a standard technique. For example, a halftone phase shift mask blank comprising a halftone phase shift film and a light-shielding film or antireflective film of chromium base material deposited thereon may be processed as follows.

First, a resist film adapted for electron beam (EB) lithography is formed on the chromium base material film of the halftone phase shift mask blank, exposed to a pattern of EB, and developed in a conventional way, forming a resist pattern. While the resist pattern thus obtained is used as etching mask, oxygen-containing chlorine base dry etching is carried out for transferring the resist pattern to the chromium base material film. Next, while the chromium base material film pattern is used as etching mask, fluorine base dry etching is carried out for transferring the pattern to the halftone phase shift film. If any region of the chromium base material film is to be left as a light-shielding film, a resist pattern for protecting that region is formed. Thereafter, the unnecessary chromium base material film is stripped off by oxygen-containing chlorine base dry etching again. The resist material is removed in a conventional manner, yielding a halftone phase shift photomask.

In another example, a halftone phase shift mask blank comprising a halftone phase shift film, a light-shielding film or antireflective film of chromium base material deposited thereon, and a hard mask film of silicon base material deposited thereon may be processed as follows.

First, a resist film adapted for EB lithography is formed on the silicon base hard mask film of the halftone phase shift mask blank, exposed to a pattern of EB, and developed in a conventional way, forming a resist pattern. While the resist pattern thus obtained is used as etching mask, fluorine base dry etching is carried out for transferring the resist pattern to the silicon base hard mask film. Thereafter, oxygen-containing chlorine base dry etching is carried out for transferring the hard mask film pattern to the chromium bass material film. The resist is removed at this point. Further, while the chromium base material film pattern is used as etching mask, fluorine base dry etching is carried out for transferring the pattern to the halftone phase shift film and at the same time, removing the silicon base hard mask film. If any region of the chromium base material film is to be left as a light-shielding film, a resist pattern for protecting that region is formed. Thereafter, the unnecessary chromium base material film is stripped off by oxygen-containing chlorine base dry etching again. The resist material is removed in a conventional manner, yielding a halftone phase shift photomask.

In a photolithographic method for forming a pattern with a half pitch of up to 50 nm, typically up to 30 nm, and more typically up to 20 nm in a processable substrate, comprising the steps of forming a photoresist film on the processable substrate and exposing the photoresist film to light of wavelength up to 200 nm, typically ArF excimer laser (193 nm) or $F_2$ laser (157 nm), through a patterned mask for transferring the pattern to the photoresist film, the halftone phase shift photomask of the invention is best suited for use in the exposure step.

The pattern exposure method of the invention is by preparing a photomask from the photomask blank and projecting light to the photomask pattern including the pattern of halftone phase shift film for transferring the photomask pattern to an object (photoresist film) on the processable substrate. The irradiation of exposure light may be either dry exposure or immersion exposure. The exposure method of the invention is effective particularly when a wafer of at least 300 mm as the processable substrate is exposed to a photomask pattern of light by the immersion lithography with the tendency that a cumulative irradiation energy dose increases within a relatively short time in commercial scale microfabrication.

As the dose of ArF excimer laser light irradiated for pattern transfer increases, the photomask is given damages other than haze. If was found that the line width of the mask pattern changes in accordance with the cumulative irradiation energy dose. See Non-Patent Document 1, Thomas Faure et al., "Characterization of binary mask and attenuated phase shift mask blanks for 32 nm mask fabrication," Proc. of SPIE, vol. 7122, pp712209-1 to 712.209-12. This problem is that as the cumulative irradiation energy dose increases during long-term irradiation of ArF excimer laser light, a layer of a substance which is considered to be an oxide of the pattern material grows outside the film pattern, whereby the pattern width changes. It is reported that the mask once damaged cannot be restored by cleaning with aqueous ammonia/hydrogen peroxide mixture or sulfuric acid/hydrogen peroxide mixture as used in the above-mentioned haze removal. It is believed that the damage source is utterly different.

Non-Patent Document 1 points out that upon exposure of a circuit pattern through a halftone phase shift mask which is the mask technology useful in expanding the depth of focus, substantial degradation is induced by pattern size variation resulting from alternation of a transition metal/silicon base material film such as MoSi base material film by irradiation of ArF excimer laser light (this degradation, is referred to as "pattern size variation degradation"). Then, in order to use an expensive photomask over a long period of time, it is necessary to address the pattern size variation degradation by irradiation of ArF excimer laser light.

As pointed out in Non-Patent Document 1, the pattern size variation degradation by irradiation of ArF excimer laser light does scarcely occur when light is irradiated in a dry air atmosphere. Exposure in a dry air atmosphere is regarded as a new approach for inhibiting the pattern size variation degradation. However, the control of a dry air atmosphere adds an extra unit to the exposure system and gives rise to electrostatic and other problems to be managed, leading to an increased expense. It is thus needed to enable long-term exposure in a common atmosphere that does not need complete removal of humidity (typically having a humidity of around 50%).

One type of photomask used in the lithography using ArF excimer laser light as light source is a halftone phase shift mask which uses a transition metal-containing silicon base material, typically a molybdenum-containing silicon base material. This silicon base material is mainly composed of a transition metal and silicon, and further contains nitrogen and/or oxygen as light element (e.g., Patent Document 1), or further contains a minute amount of carbon and/or hydrogen (e.g., Patent Document 7). Suitable transition metals used include Mo, Zr, Ta, W, and Ti. Among others, Mo is most commonly used (e.g., Patent Document 1), and sometimes a second, transition metal is added (e.g., Patent Document 8), For the light-shielding film as well, a transition metal-containing silicon base material, typically a molybdenum-containing silicon base material is used.

However, when a photomask using a transition metal/silicon base material is irradiated with a large dose of high-energy radiation, the mask undergoes significant pattern size variation degradation by irradiation of high-energy radiation.

Then the service lifetime of the photomask is shorter than the requirement. It is a serious problem that the photomask pattern of transition metal/silicon base material changes its line width when it is exposed to ArF excimer laser light.

The problem of pattern size variation associated with the halftone phase shift film of transition metal/silicon base material is overcome by the halftone phase shift photomask having a halftone phase shift film of transition metal-free silicon base material according to the invention.

EXAMPLE

Examples are given below for further illustrating the invention although the invention is not limited thereto.

Example 1

On a quarts substrate of 152 mm squares and 6.35 mm thick, a halftone phase shift film of SiN was deposited by a sputtering process using a silicon target as a sputter target and nitrogen gas and argon gas as the sputter gas. The deposition time was adjusted such that the deposited film might provide a phase shift of 178° relative to light of wavelength 193 nm (i.e., ArF excimer laser). The film had a transmittance of 19% relative to light of wavelength 193 nm and a thickness of 59 nm.

The film was analyzed for composition by x-ray photoelectron spectroscopy (XPS), finding a silicon/nitrogen atomic ratio of 1/1. The film had a refractive index of 2.6 and an absorption coefficient of 0.35 relative to light of wavelength 193 nm. The film was tested for chemical resistance by immersing in an ammonia/hydrogen peroxide cleaning liquid (28 wt % aqueous ammonia/30 wt % aqueous hydrogen peroxide/water=1/1/100 by volume) at room temperature (23° C.) for 240 minutes. A change of phase shift was 1.24°.

Example 2

On a quarts substrate of 152 mm squares and 6.35 mm thick, a halftone phase shift film of SiON was deposited by a sputtering process using a silicon target as a sputter target and oxygen gas, nitrogen gas and argon gas as the sputter gas. The deposition time was adjusted such that the deposited film might provide a phase shift of 178° relative to light of wavelength 193 nm. The film had a transmittance of 24% relative to light or wavelength 193 nm and a thickness of 63 nm.

The film was analyzed for composition by XPS, finding a silicon/nitrogen/oxygen atomic ratio of 5/5/1. The film had a refractive index of 2.5 and an absorption coefficient of 0.27 relative to light of wavelength 193 nm. The film was tested for chemical resistance as in Example 1, finding a change of phase shift of 0.28°.

Example 3

On a quarts substrate of 152 mm squares and 6.35 mm thick, a halftone phase shift film of SiON was deposited by a sputtering process using a silicon target as a sputter target and oxygen gas, nitrogen gas and argon gas as the sputter gas. The deposition time was adjusted such that the deposited film might provide a phase shift of 176° relative to light of wavelength 193 nm. The film had a transmittance of 28% relative to light of wavelength 193 nm and a thickness of 66 nm.

The film was analyzed for composition by XPS, finding a silicon/nitrogen/oxygen atomic ratio of 3/3/1. The film had a refractive index of 2.4 and an absorption coefficient of 0.22 relative to light of wavelength 193 nm. The film was tested for chemical resistance as in Example 1, finding a change of phase shift of 1.07°.

Example 4

On a quarts substrate of 152 mm squares and 6.35 mm thick, a layer of SiN was deposited by a sputtering process using a silicon target as a sputter target and nitrogen gas and argon gas as the sputter gas. A layer of SiON was deposited on the SiN layer by a sputtering process using a silicon target as the sputter target and oxygen gas, nitrogen gas and argon gas as the sputter gas. In this way, there was formed a halftone phase shift film of two layers of SiN and SiON. The deposition time was adjusted such that the SiN layer might have a thickness of 45 nm. The deposition time for the SiON layer was adjusted such that the overall halftone phase shift film might provide a phase shift of 180° relative to light of wavelength 193 nm. The SiON layer had a thickness of 21 nm. The overall halftone phase shift film had a transmittance of 29% relative to light of wavelength 193 nm and a thickness of 66 nm.

The film was analyzed for composition by XPS. The SiN layer had a silicon/nitrogen atomic ratio of 1/1 and the SiON layer had a silicon/nitrogen/oxygen atomic ratio of 2/1/2. The SiN layer had a refractive index of 2.6 and an absorption coefficient of 0.34, and the SiON layer had a refractive index of 2.0 and an absorption coefficient of 0.08, relative to light of wavelength 193 nm. The film was tested for chemical resistance as in Example 1, finding a change of phase shift of 2.26°.

Comparative Example 1

On a quarts substrate of 152 mm squares and 6.35 mm thick, a halftone phase shift film of MoSiON was deposited by a sputtering process using a target containing molybdenum and silicon and having a molybdenum/silicon atomic ratio of 1/2 and a silicon target as sputter targets and oxygen gas. nitrogen gas and argon gas as the sputter gas. The deposition time was adjusted such that the deposited film might provide a phase shift of 177° relative to light of wavelength 193 nm. The film had a thickness of 74 nm.

The film was analyzed for composition by XPS, finding a molybdenum/silicon/nitrogen/oxygen atomic ratio of 1/4/4/1. The film was tested for chemical resistance as in Example 1, finding a noticeable change of phase shift of 10.8°.

Comparative Example 2

On a quarts substrate of 152 mm squares and 6.35 mm thick, a halftone phase shift film of MoSiON was deposited by a sputtering process using a target containing molybdenum and silicon and having a molybdenum/silicon atomic ratio of 1/2 and a silicon target as sputter targets and oxygen gas, nitrogen gas and argon gas as the sputter gas. The deposition time was adjusted such that the deposited film might provide a phase shift of 177°. The film had a transmittance of 33% relative to light of wavelength 193 nm and an increased thickness of 92 nm.

The film was analyzed for composition by XPS, finding a molybdenum/silicon/nitrogen/oxygen atomic ratio of 1/13/8/12. The film had a refractive index of 2.0 and an absorption coefficient of 0.17, relative to light of wavelength 193 nm.

Japanese Patent Application Nos. 2013-229984 and 2014-184992 are incorporated herein by reference.

Although some preferred embodiments have been described, many modifications and variations may be made thereto in light of the above teachings. It is therefore to be understood that the invention may foe practiced otherwise than as specifically described without departing from the scope of the appended claims.

The inventiom claimed is:

1. A halftone phase shift photomask blank comprising a transparent substrate and a halftone phase shift film thereon,
said halftone phase shift film consisting of silicon and nitrogen, or silicon, nitrogen and oxygen, providing a transmittance of at least 10% and a phase shift of 150° to 200° relative to light of wavelength up to 200 nm, and having a thickness of up to 70 nm,
said halftone phase shift film being a single layer consisting of silicon and nitrogen, or silicon, nitrogen and oxygen, with the content of oxygen being up to 1/3 of the content of nitrogen as expressed in atomic ratio, and having a refractive index of at least 2.4 and an absorption coefficient of 0.22 to 0.54, or a multilayer film including at least one layer consisting of silicon and nitrogen, or silicon, nitrogen and oxygen, with the content of oxygen being up to 1/3 of the content of nitrogen as expressed in atomic ratio, and having a refractive index of at least 2.4 and an absorption coefficient of 0.22 to 0.54.

2. The photomask blank of claim 1 wherein said halftone phase shift film consists of silicon and nitrogen.

3. The photomask blank of claim 1 wherein said halftone phase shift film is a multilayer film including at least one layer consisting of silicon and nitrogen and at least one layer consisting of silicon, nitrogen and oxygen.

4. The photomask blank of claim 1 from which a halftone phase shift photomask is prepared, wherein in a photolithographic method for forming a pattern with a half pitch of up to 50 nm in a processable substrate, the method comprising the steps of forming a photoresist film on the processable substrate, and exposing patternwise the photoresist film to light of wavelength up to 200 nm for thereby transferring the pattern to the photoresist film, the photomask is used in the exposure step.

5. A halftone phase shift photomask comprising a transparent substrate and a photomask pattern of halftone phase shift film thereon,
said halftone phase shift film consisting of silicon and nitrogen, or silicon, nitrogen and oxygen, providing a transmittance of at least 10% and a phase shift of 150° to 200° relative to light of wavelength up to 200 nm, and having a thickness of up to 70 nm,
said halftone phase shift film being a single layer consisting of silicon and nitrogen, or silicon, nitrogen and oxygen, with the content of oxygen being up to 1/3 of the content of nitrogen as expressed in atomic ratio, and having a refractive index of at least 2.4 and an absorption coefficient of 0.22 to 0.54, or a multilayer film including at least one layer consisting of silicon and nitrogen, or silicon, nitrogen and oxygen, with the content of oxygen being up to 1/3 of the content of nitrogen as expressed in atomic ratio, and having a refractive index of at least 2.4 and an absorption coefficient of 0.22 to 0.54.

6. The photomask of claim 5 wherein said halftone phase shift film consists of silicon and nitrogen.

7. The photomask of claim 5 wherein said halftone phase-shift film is a multilayer film including at least one layer consisting of silicon and nitrogen and at least one layer consisting of silicon, nitrogen and oxygen.

8. The photomask of claim 5 wherein in a photolithographic method for forming a pattern with a half pitch of up to 50 nm in a processable substrate, the method comprising the steps of forming a photoresist film on the processable substrate, and exposing patternwise the photoresist film to light of wavelength up to 200 nm for thereby transferring the pattern to the photoresist film, the photomask is used in the exposure step.

9. A pattern exposure method involved in photolithographic formation of a pattern with a half pitch of up to 50 nm in a processable substrate, wherein the pattern is transferred to a photoresist film on the processable substrate, using exposure light of wavelength up to 200 nm, the pattern exposure method using a halftone phase shift photomask, said halftone phase shift photomask comprising a transparent substrate and a photomask pattern of halftone phase shift film thereon, said halftone phase shift film consisting of silicon and nitrogen, or silicon, nitrogen and oxygen, providing a transmittance of at least 10% and a phase shift of 150° to 200° relative to light of wavelength up to 200 nm, and having a thickness of up to 70 nm.

said halftone phase shift film being a single layer consisting of silicon and nitrogen, or silicon, nitrogen and oxygen, with the content of oxygen being up to 1/3 of the content of nitrogen as expressed in atomic ratio, and having a refractive index of at least 2.4 and an absorption coefficient of 0.22 to 0.54, or a multilayer film including at least one layer consisting of silicon and nitrogen, or silicon, nitrogen and oxygen, with the content of oxygen being up to 1/3 of the content of nitrogen as expressed in atomic ratio, and having a refractive index of at least 2.4 and an absorption coefficient of 0.22 to 0.54.

10. The method of claim 9 wherein said halftone phase shift film consists of silicon and nitrogen.

11. The method of claim 9 wherein said halftone phase shift film is a multilayer film including at least one layer consisting of silicon and nitrogen and at least one layer consisting of silicon, nitrogen and oxygen.

* * * * *